(12) United States Patent
Hook et al.

(10) Patent No.: US 9,601,513 B1
(45) Date of Patent: Mar. 21, 2017

(54) SUBSURFACE WIRES OF INTEGRATED CHIP AND METHODS OF FORMING

(71) Applicant: GLOBALFOUNDRIES Inc., Grand Cayman (KY)

(72) Inventors: Terence B. Hook, Jericho, VT (US); Andreas Scholze, Colchester, VT (US); Lars W. Liebmann, Poughquag, NY (US); Roger A. Quon, Rhinebeck, NY (US); Andrew H. Simon, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/977,899

(22) Filed: Dec. 22, 2015

(51) Int. Cl.
*H01L 27/12* (2006.01)
*H01L 23/528* (2006.01)
(Continued)

(52) U.S. Cl.
CPC ........ *H01L 27/1211* (2013.01); *H01L 21/266* (2013.01); *H01L 21/3065* (2013.01); *H01L 21/31116* (2013.01); *H01L 21/31155* (2013.01); *H01L 21/76802* (2013.01); *H01L 21/76877* (2013.01); *H01L 21/84* (2013.01); *H01L 23/528* (2013.01); *H01L 23/53209* (2013.01);
(Continued)

(58) Field of Classification Search
CPC . H01L 27/1211; H01L 21/3065; H01L 21/84; H01L 29/0649; H01L 21/266; H01L 21/31155; H01L 23/528; H01L 21/31116; H01L 21/76802; H01L 21/76877; H01L 23/53257; H01L 23/53271; H01L 23/53209
See application file for complete search history.

(56) References Cited

U.S. PATENT DOCUMENTS 5,621,239 A 4/1997 Horie et al.
6,429,477 B1 8/2002 Mandelman et al.
(Continued)

FOREIGN PATENT DOCUMENTS

WO 2014044929 A1 3/2014

OTHER PUBLICATIONS

Charavel et al., "Etch Rate Modification of SiO2 by Ion Damage," 2006, pp. G245-G247, Electrochemical and Solid-State Letters, vol. 9, No. 7.
(Continued)

*Primary Examiner* — Thanh Y Tran
(74) *Attorney, Agent, or Firm* — Yuanmin Cai; Hoffman Warnick LLC

(57) ABSTRACT

Various embodiments include methods and integrated circuit structures. One method includes masking a structure with a mask to cover at least a portion of the structure under the mask, selectively implanting a material through a semiconductor layer and into a buried insulator layer forming an implant region. The implant region is substantially parallel to and below an upper surface of the structure. The method may also include masking an additional portion of the structure; etching a set of access ports though the semiconductor layer and partially through the insulator layer into the implant region; etching at least one tunnel below the upper surface of the structure in the implant region using the set of access; and depositing a conductor into the at least one tunnel and the set of access ports.

17 Claims, 13 Drawing Sheets

(51) Int. Cl.

| | | |
|---|---|---|
| *H01L 21/84* | (2006.01) | |
| *H01L 29/06* | (2006.01) | |
| *H01L 21/266* | (2006.01) | |
| *H01L 21/3115* | (2006.01) | |
| *H01L 21/3065* | (2006.01) | |
| *H01L 21/311* | (2006.01) | |
| *H01L 21/768* | (2006.01) | |
| *H01L 23/532* | (2006.01) | |

(52) U.S. Cl.
CPC .. *H01L 23/53257* (2013.01); *H01L 23/53271* (2013.01); *H01L 29/0649* (2013.01)

(56) References Cited

U.S. PATENT DOCUMENTS

| | | |
|---|---|---|
| 6,566,176 B1 | 5/2003 | Chan |
| 6,635,550 B2 | 10/2003 | Houston |
| 7,141,853 B2 | 11/2006 | Campbell et al. |
| 7,923,840 B2 | 4/2011 | Costrini et al. |
| 7,977,172 B2 * | 7/2011 | Cho ................ H01L 27/108 |
| | | 257/E21.561 |
| 8,119,474 B2 | 2/2012 | Bryant et al. |
| 9,478,600 B2 * | 10/2016 | Wang ................ H01L 21/743 |
| 2001/0016367 A1 * | 8/2001 | Ziegler ............ B81C 1/00246 |
| | | 438/50 |

OTHER PUBLICATIONS

Charavel et al., "Buried Mask Revelation in Silicon Dioxide for Double Gate MOS Fabrication," 2006, Proceedings of the 1st IEEE International Conference on Nano/Micro Engineered and Molecular Systems.

Huang et al., "3-D, Self-aligned, Micro-assembled, Electrical Interconnects for Heterogeneous Integration," 2003, 13 pages, Conference: Micromachining and Microfabrication.

\* cited by examiner

SUBSURFACE WIRES OF INTEGRATED CHIP AND METHODS OF FORMING

BACKGROUND

The subject matter disclosed herein relates to integrated circuit devices. More particularly, the subject matter relates to Silicon on Insulator (SOI) devices including subsurface wires, and methods of forming subsurface wires therein.

As integrated circuit (IC) technologies have advanced, the size of these devices has correspondingly decreased. In particular, as devices are reduced in scale to comply with ever-smaller packaging, tighter constraints are applied to their dimensions and spacings.

As device dimensions are reduced, the line resistance and via resistance within an IC can increase, causing signal propagation delays, and reduced performance of that IC. In SOI devices, the formation of traditional interconnects can be difficult, and may cause noise, thermal increases, and other interference.

SUMMARY

Various embodiments include methods of forming integrated circuit (IC) structures, and the structures formed by such methods.

A first aspect includes a method comprising: masking a structure with a mask to cover at least a portion of the structure under the mask, the structure comprising: a substrate, a buried insulator layer disposed above the substrate, and a semiconductor layer disposed above the buried insulator layer; selectively implanting a material through the semiconductor layer and into the buried insulator layer forming an implant region, wherein the implant region is substantially parallel to and below an upper surface of the structure; masking an additional portion of the structure with an additional mask to cover an additional portion under the additional mask; etching a set of access ports though the semiconductor layer and partially through the insulator layer into the implant region in the buried insulator layer; etching at least one tunnel below the upper surface of the structure in the implant region using the set of access ports by removing at least a portion of the implant region; and depositing a conductor into the at least one tunnel and the set of access ports.

A second aspect includes a method including: masking a structure with a mask to cover at least a portion of the structure under the mask, the structure comprising: a substrate, a buried insulator layer disposed above the substrate, and a semiconductor layer disposed above the buried insulator layer, and a transistor above the semiconductor layer; selectively implanting a material through the transistor and semiconductor layer and into the buried insulator layer, forming an implant region, wherein the implant region is substantially parallel to and below an upper surface of the structure; masking an additional portion of the structure with an additional mask to cover the transistor; etching a set of access ports though the semiconductor layer and partially through the buried insulator layer into the implant region in the buried insulator layer; etching at least one tunnel below the upper surface of the structure in the implant region using the set of access ports by removing at least a portion of the implant region; and depositing a conductor into the at least one tunnel and the set of access ports A third aspect includes an integrated circuit (IC) structure comprising: a substrate; a buried insulator layer over the substrate; a silicon on insulator layer above the buried insulator layer; at least one wire within the buried insulator layer, the at least one wire being substantially parallel to and below an upper surface of the buried insulator layer; a transistor in the silicon on insulator layer; and a set of wires extending around the transistor in the silicon on insulator layer and through the buried insulator layer to electronically contact the at least one wire within the buried insulator layer, wherein the at least one wire and the set of wires includes at least one of a group comprising: doped polysilicon, tungsten, and indium.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
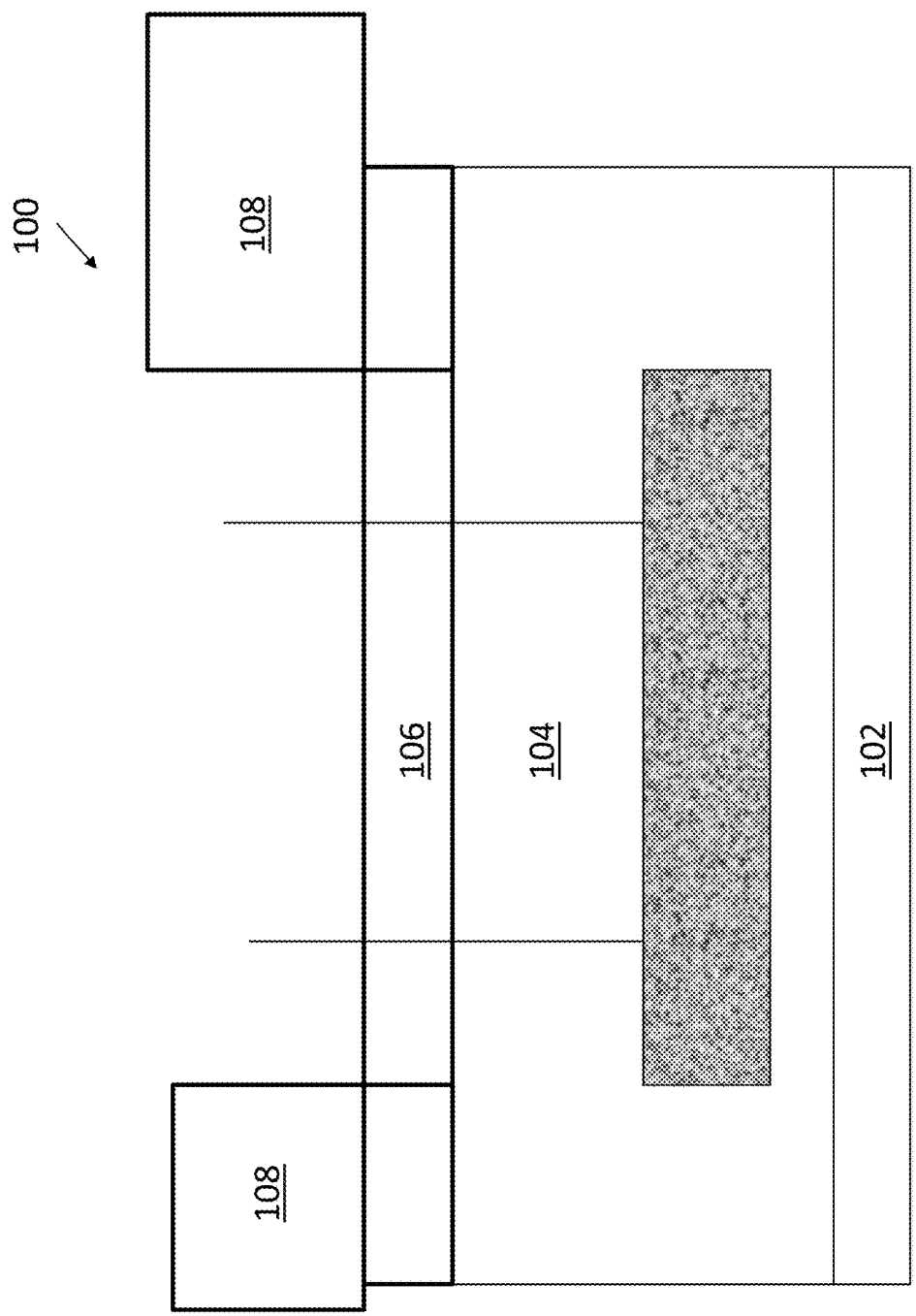
FIG. 1 shows a schematic cross-sectional depiction of a precursor structure according to various embodiments.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

As noted, the subject matter disclosed herein relates to integrated circuit (IC) devices. More particularly, the subject matter relates to subsurface tunnels in integrated circuit devices, including Silicon on Insulator (SOI) devices.

According to various embodiments, methods include selectively implanting a buried insulator layer of a structure to form an implant region, etching access points to the implant region, etching tunnels by removing at least a portion of the implant region. In particular, these processes can be performed before or after the addition of a transistor or other device layer. The tunnels and access ports can then be filled with a conductive material, for instance tungsten, a doped polysilicon, or indium.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

As described herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIGS. 1-13 show schematic cross-sectional depictions of integrated circuit structures (and precursor structures) that illustrate processes performed according to various embodiments. It is understood that the processes outlined herein may be performed in a different order than described in some embodiments. Additionally, not all of the processes outlined herein need necessarily be performed according to various embodiments.

Turning to FIG. 1, a cross-sectional view of a precursor structure of an integrated circuit (IC) 100 is shown. In some embodiments, for instance when subsurface tunnels are formed prior to the addition of a transistor or other device layer, the precursor structure can include a substrate 102, a buried insulator layer 104 disposed above substrate 102, and a semiconductor layer 106 disposed above buried insulator layer 104. The precursor structure may be thus implanted selectively, as indicated by arrows in FIG. 1, by applying a mask 108 in any portion where implanting is not desired. The term "mask" may be given to a layer of material which is applied over an underlying layer of material, and patterned to have openings, so that the underlying layer can be processed, e.g., etched, where there are openings. After processing the underlying layer, the mask may be removed. Common masking materials are photoresist (resist) and nitride. Nitride is usually considered to be a "hard mask." Mask 108, which may include more than one mask as illustrated in FIG. 1, is of sufficient thickness to block the disclosed implanting.

Implanting of a desired material, which may be an atomic species, for instance silicon, may then be accomplished, for example, by conventional implanting approaches known in the art. The implanted species is implanted with sufficient dosage and energy so that the species may pass through semiconductor layer 106 and into buried insulator layer 104 at a depth determined by the method and parameters of the implanting chosen. In some embodiments, a center of implant region 110 may be approximately 150 nm below a top surface of semiconductor layer 106. The implant region 110 in the buried insulator layer 104 should not appreciably overlap with substrate 102. Therefore, the implantation essentially damages buried insulator layer 104 such that etching a tunnel below the surface of the structure within the buried insulator layer 104 is easier to achieve. The center of the tunnel may be from about 50 nm to about 150 nm from the bottom of semiconductor layer 106 and ranges therebetween. Preferably, the center of the tunnel may be from about 75 nm to about 125 nm.

In some embodiments, buried insulator layer 104 may include an interlayer dielectric such as oxide, forming a buried oxide (BOX) layer, or may include other interlay dielectrics such as but not limited to: fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Substrate 102 and semiconductor-on-insulator (SOI) layer 106 can include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. For example, substrate 102 and/or SOI layer 106 may be strained.

Figure 2:
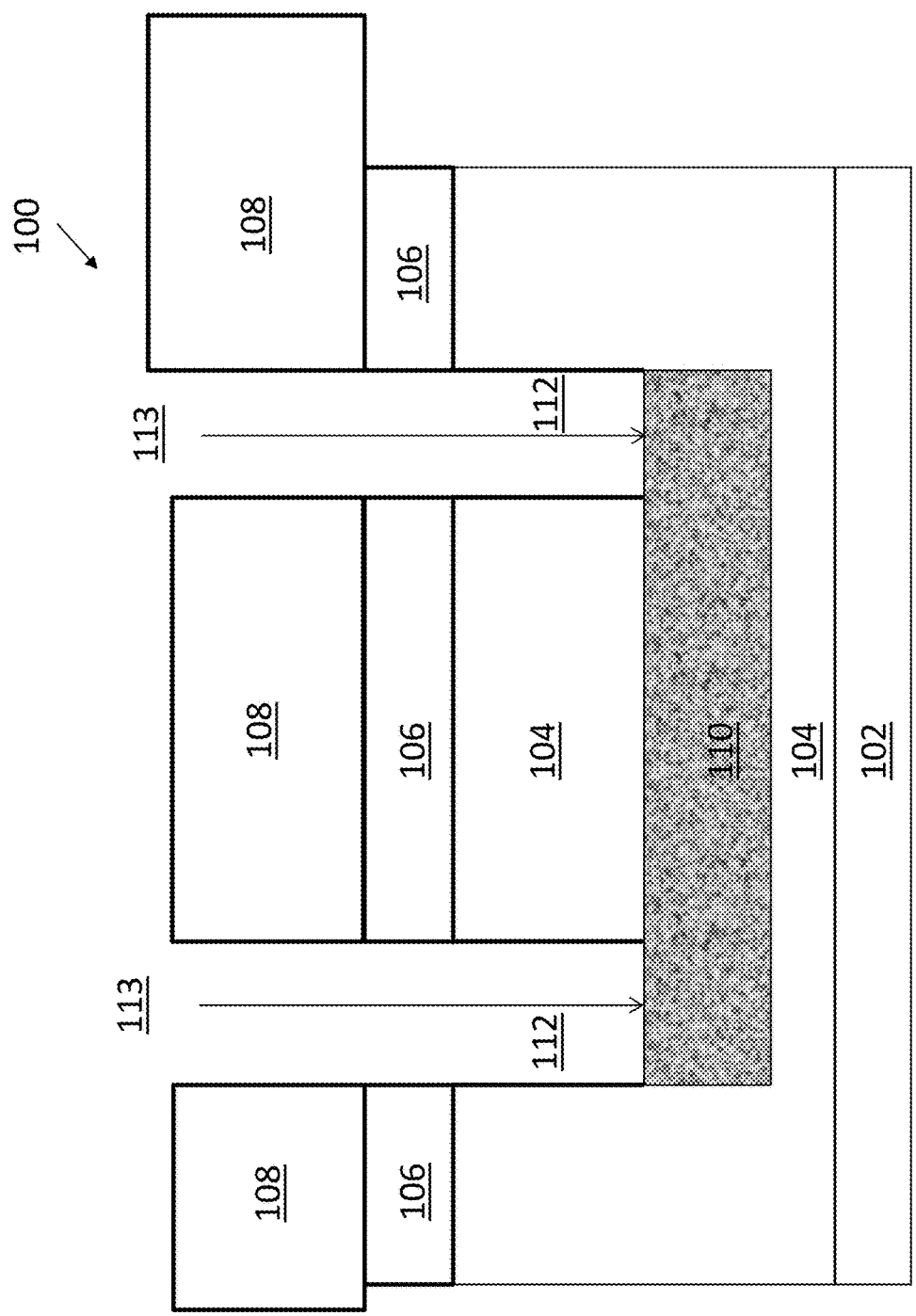
FIG. 2 shows a schematic cross-sectional depiction of a structure undergoing a process according to various embodiments.

FIG. 2 shows a process according to various embodiments, including adding another additional mask 108 to allow for the formation of a set of access ports 112. While two access ports 112 are shown, it should be understood that any number of access ports can be etched into precursor structure depending on the number of subsurface tunnels intended to be formed in following steps. Thus, the number and location of openings 113 in masks 108 will correlate to the number and location of access ports 112 being etched. Access ports 112 can be formed by etching, as indicated by arrows in FIG. 2, through semiconductor layer 106 and at least partially through buried insulator layer 104 to implanted region 110. In some embodiments, etching of access ports may comprise reactive-ion etching (RIE) techniques.

Figure 3:
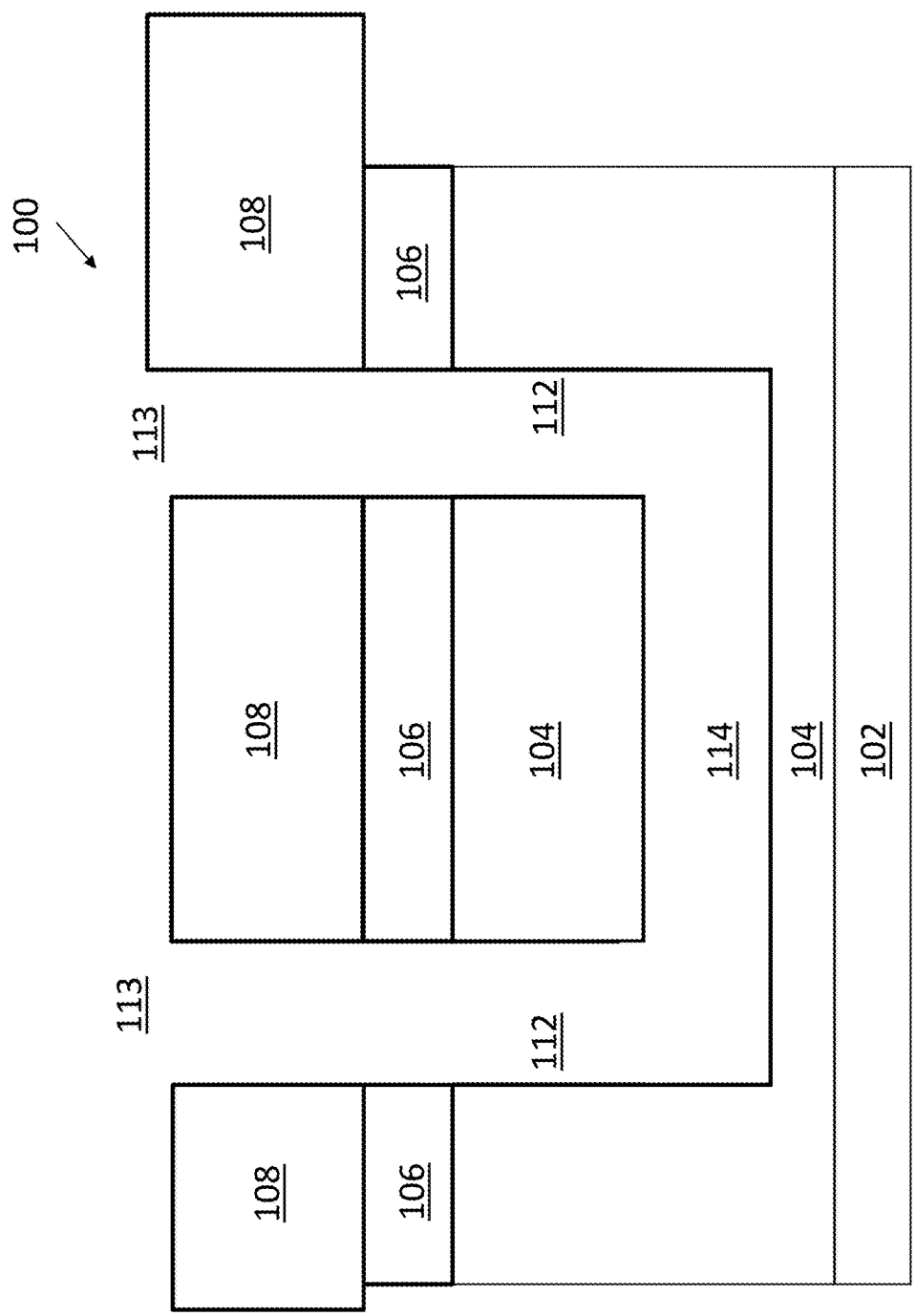
FIG. 3 shows a schematic cross-sectional depiction of a structure undergoing a process according to various embodiments.

FIG. 3 shows another process according to various embodiments, including etching at least one tunnel 114 using access ports 112. This can be accomplished by etching to remove at least a portion of implant region 110 (FIG. 2), in order to form subsurface tunnels. The center of tunnel 114 may be from about 50 nm to about 150 nm from the bottom of semiconductor layer 106 and ranges therebetween. Preferably, the center of the tunnel may be from about 75 nm to about 125 nm. In some embodiments, etching of tunnel 114 comprises using vapor hydrofluoric acid (Vapor HF) or similar etching techniques. Although depicted as a single tunnel 114, it should be understood that any number of tunnels can be etched below the surface of the precursor structure. Tunnels 114 etch more effectively due to the implanted species. An etch rate of 200:1 for damaged oxide to the undamaged (not implanted) oxide can be achieved, causing efficient tunnel 114 formation without removing significant amounts of the surrounding buried insulator layer 104. In some embodiments, tunnels 114 may be between approximately 100 nm and approximately 1000 nm in length, approximately 50 nm wide, and approximately 50 nm thick or deep. As used herein, the length of tunnels 114 refers to the distance from access port to access port, illustrated as left to right, or the x-axis, in the Figures. A width of tunnels 114 refers to the width into the page, or the z-axis, of the Figures, and a depth of tunnels 114 refers to the height, or the y-axis, of the Figures, using traditional axes. Following etching, masks 108 may be removed by any means known or later developed.

Figure 4:
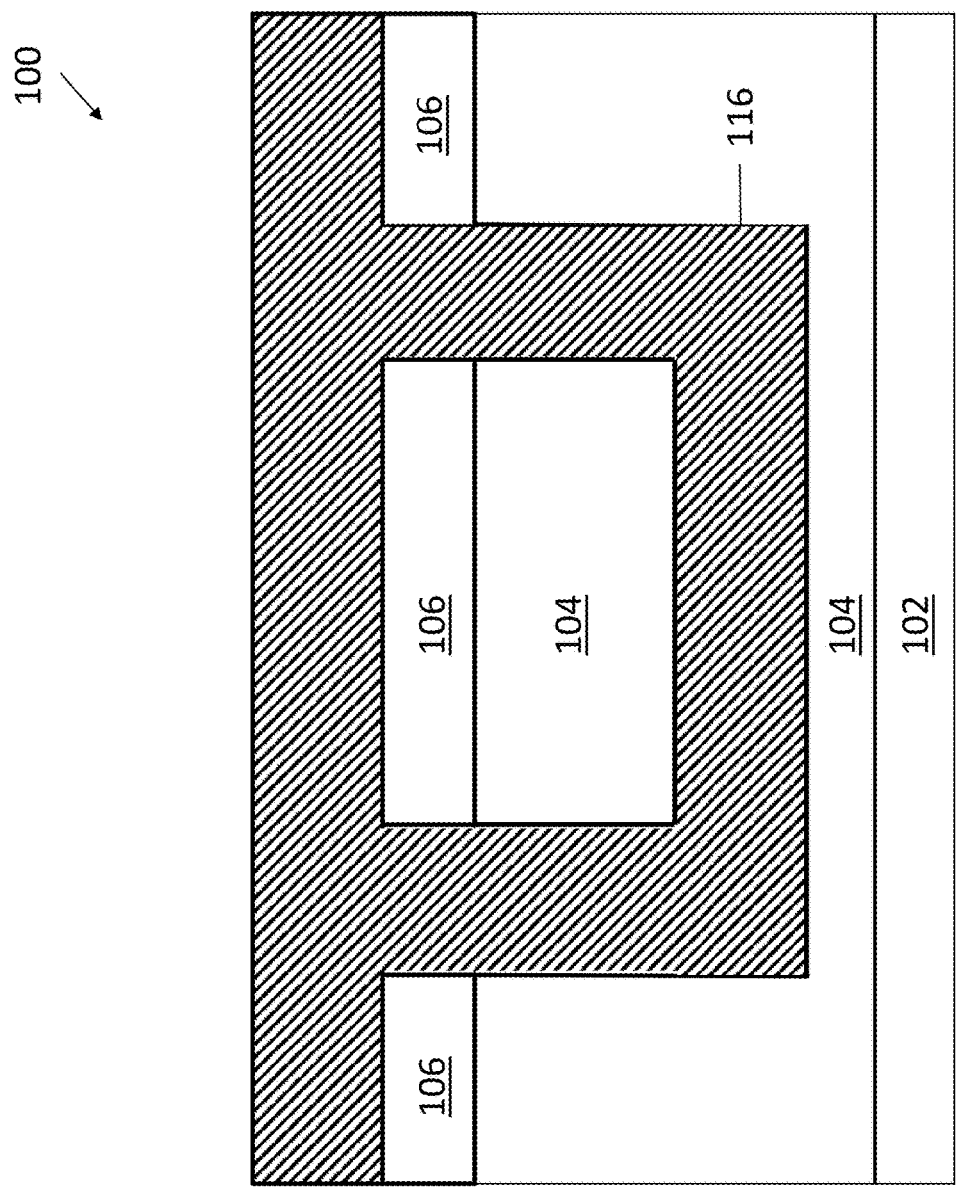
FIG. 4 shows a schematic cross-sectional depiction of a structure undergoing a process according to various embodiments.

FIG. 4 illustrates an additional process according to various embodiments, including depositing a conductor in tunnel 114 and set of access ports 112 to form wire 116. The conductor, which is a conformal conductor, can be deposited via any conventional deposition techniques known in the art, for example, chemical vapor deposition (CVD) and pouring the conductor, as a liquid, into access ports 112 and tunnel 114. Being a conformal conductor, wire 116 can be formed in access ports 112 and tunnel 114 such that there are no seams in wire 116, as illustrated in FIG. 4. Accordingly, wire 116 may be composed of a continuous material. In some cases, the conductor may include doped polysilicon, tungsten, indium, or a combination thereof. In some embodiments, tungsten is used for its conformal ability as a liquid as well as its refractory properties. However, doped polysilicon may be used where a more robust material is necessary. Similarly, in some embodiments, liquid indium may be a robust material useful according to embodiments. In order to thoroughly fill tunnel 114 and access ports 112 with a conformal conductor, a width of access ports 112 should be equal to or greater than a height of tunnel 114.

Figure 5:
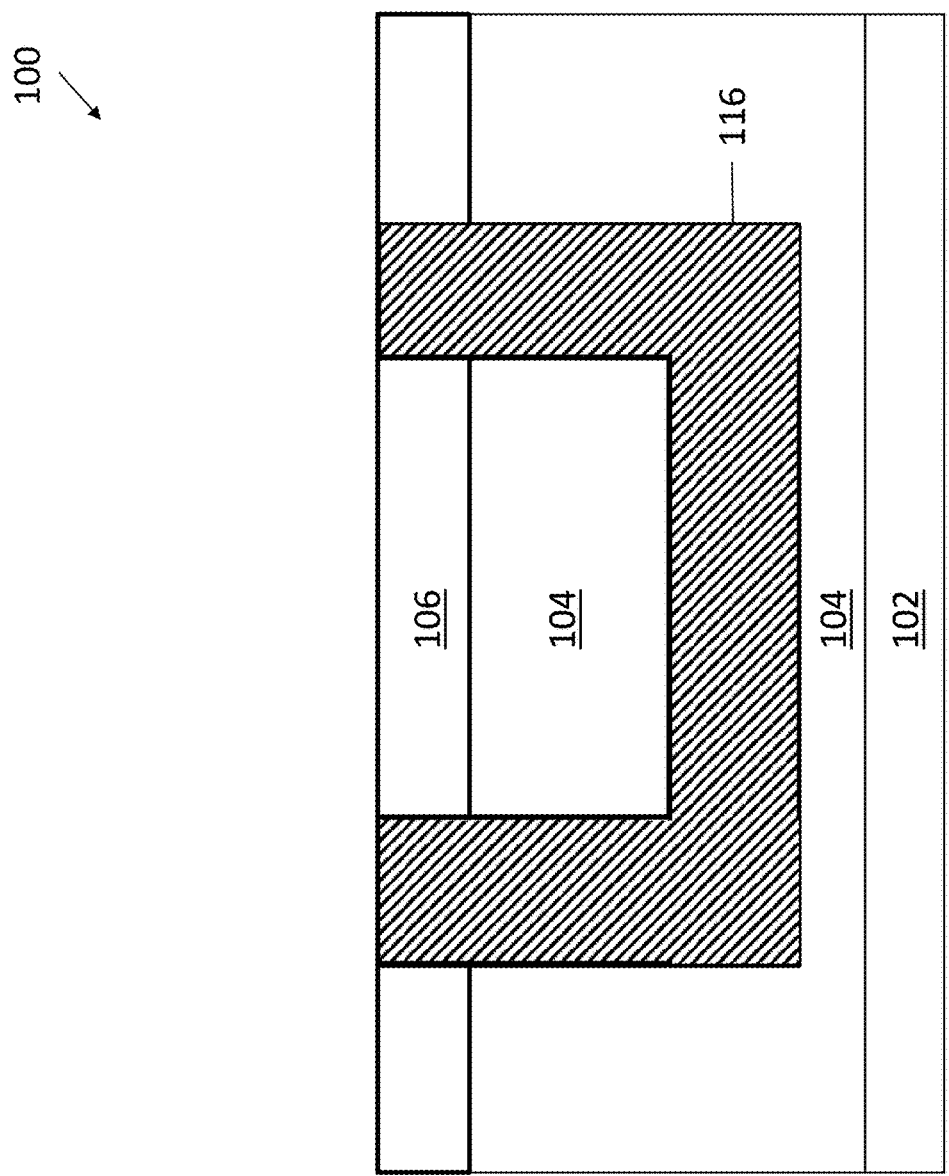
FIG. 5 shows a schematic cross-sectional depiction of a structure undergoing a process according to various embodiments.
Figure 6:
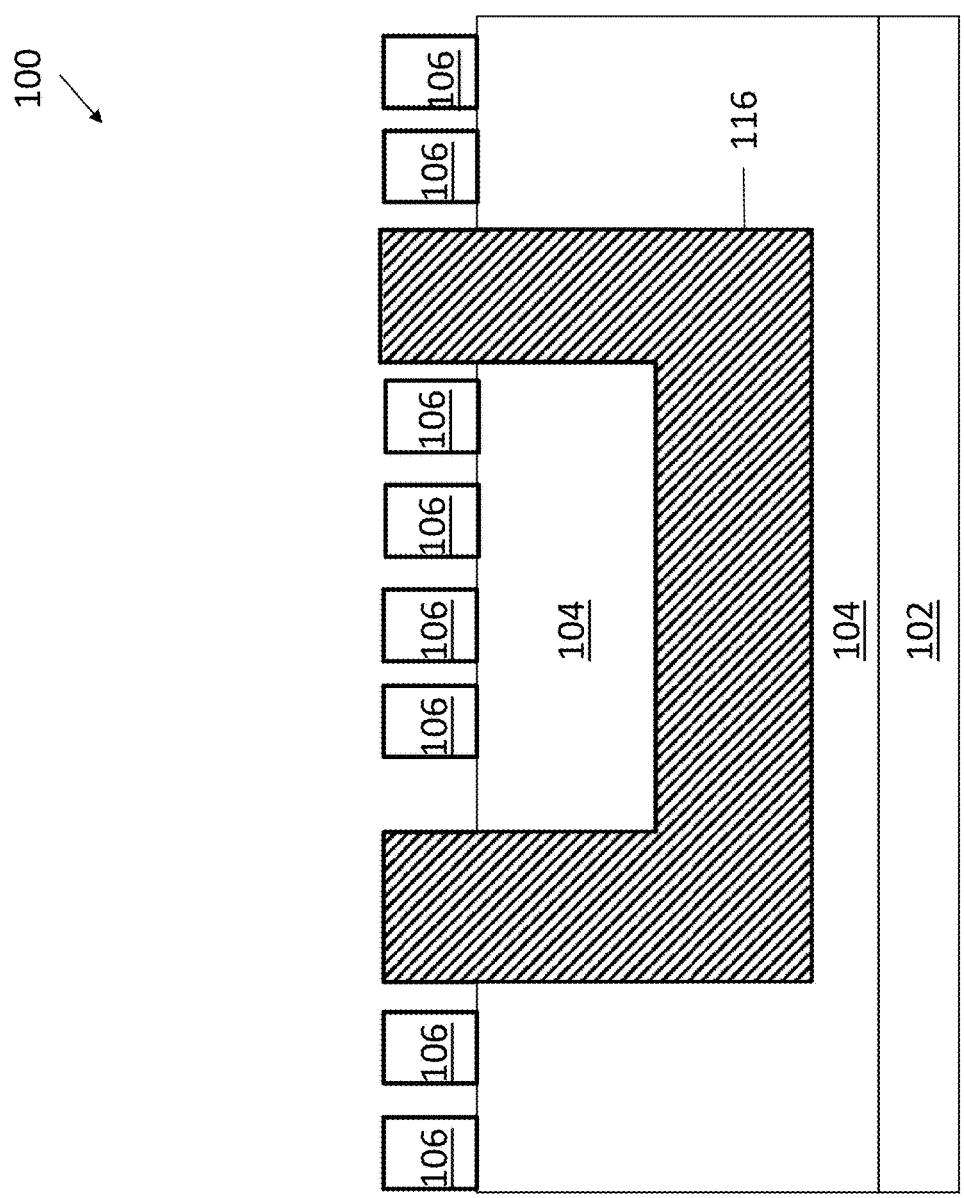
FIG. 6 shows a schematic cross-sectional depiction of an alternative process in forming a structure according to various embodiments.
Figure 7:
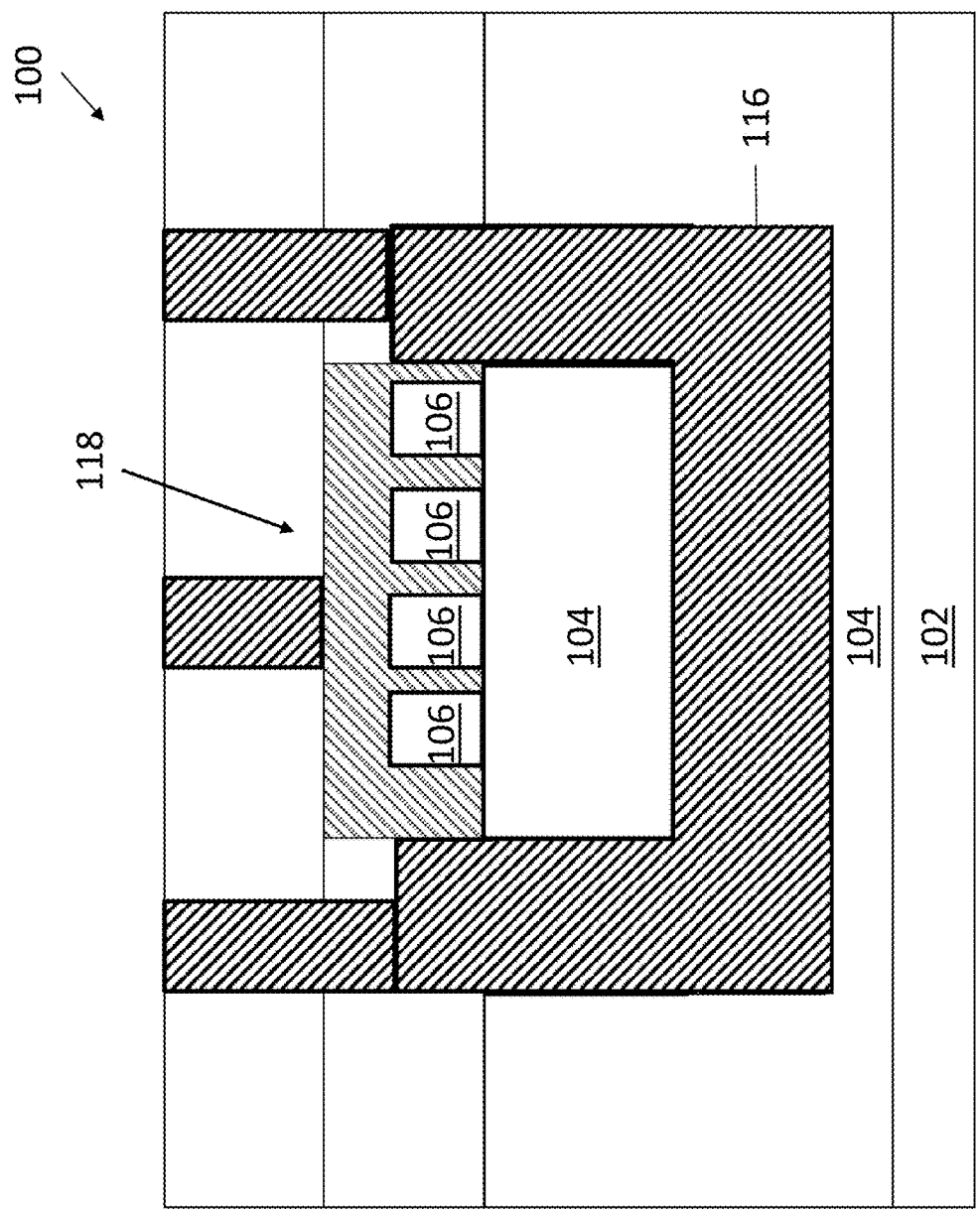
FIG. 7 shows a schematic cross-sectional depiction of an integrated circuit (IC) structure according to various embodiments.

FIG. 5 illustrates an additional process according to various embodiments, including planarizing a top surface of the precursor structure. Any now known or later developed planarizing technique may be utilized to form a smooth top surface of IC 100, e.g., chemical mechanical polishing. Following planarizing, IC 100 may continue to be processed according to the intended use of IC 100, including adding at least one transistor to IC 100, as illustrated in FIGS. 6-7. For instance, in FIG. 6, fins may be defined in semiconductor layer 106. As illustrated in FIG. 7, wiring layers 118 may be formed on a top surface of IC 100, such as a MOSFET. In some embodiments, as seen in FIG. 6, wire 116 may be electrically isolated, or as seen in FIG. 7, wire 116 may be connected to a set of wiring layers 118 (for instance, a transistor) which may be disposed above a precursor substrate 102, which may include or may be connected to a set of contacts.

Figure 8:
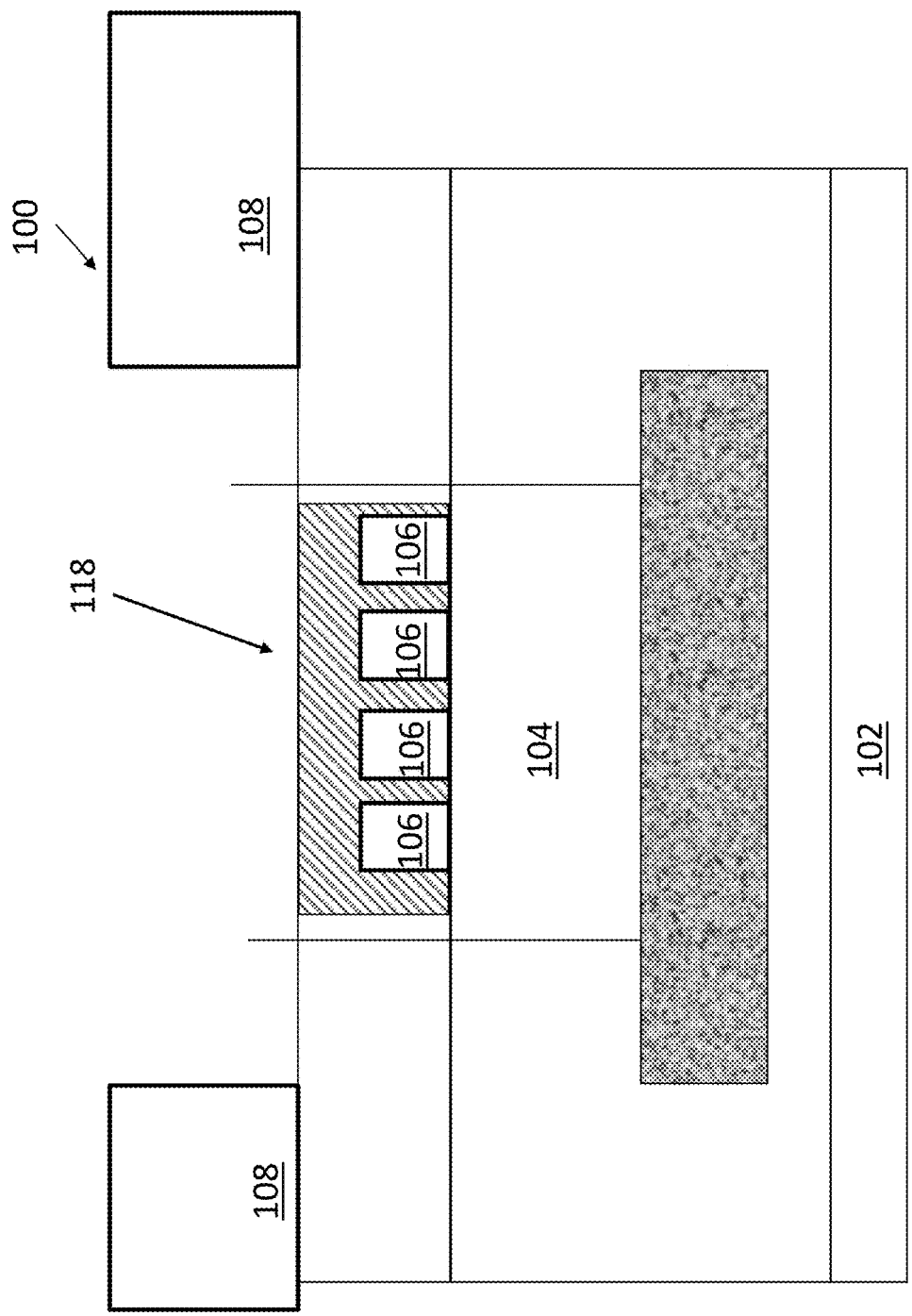
FIG. 8 shows a schematic cross-sectional depiction of an alternative process following the process described with respect to FIG. 1, according to various embodiments.
Figure 9:
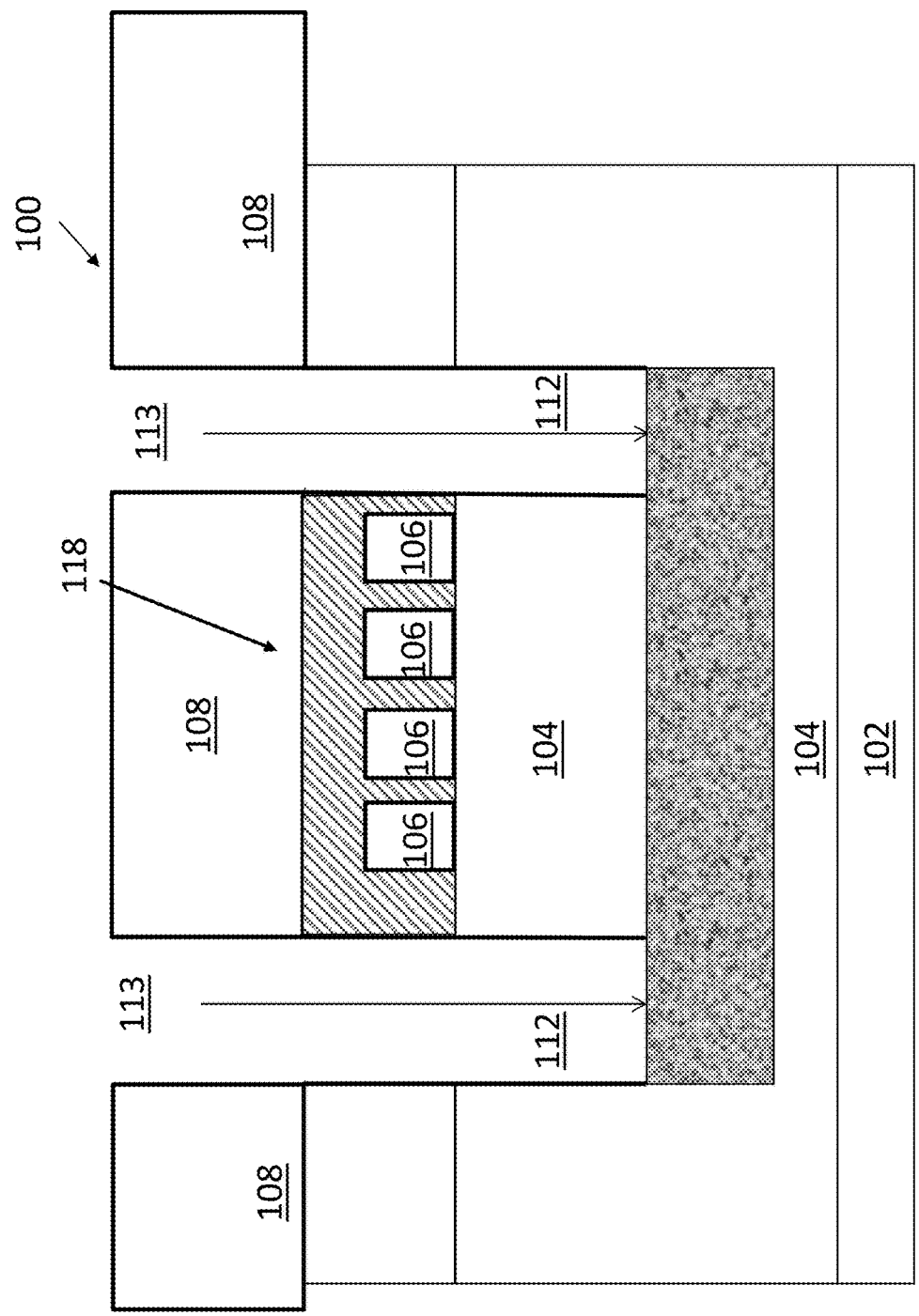
FIG. 9 shows a schematic cross-sectional depiction of a structure undergoing a process according to various additional embodiments.
Figure 10:
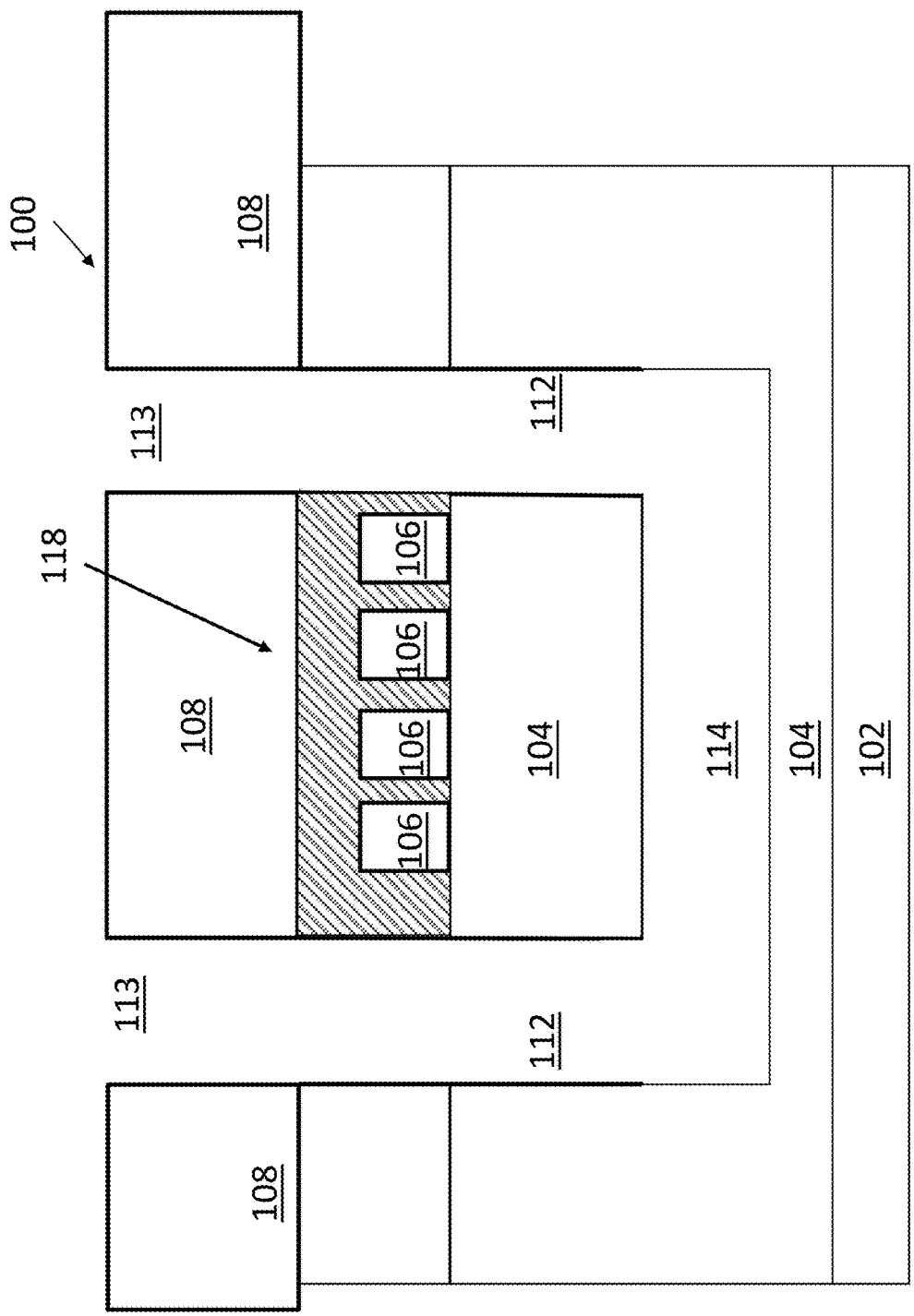
FIG. 10 shows a schematic cross-sectional depiction of a structure undergoing a process according to various additional embodiments.
Figure 11:
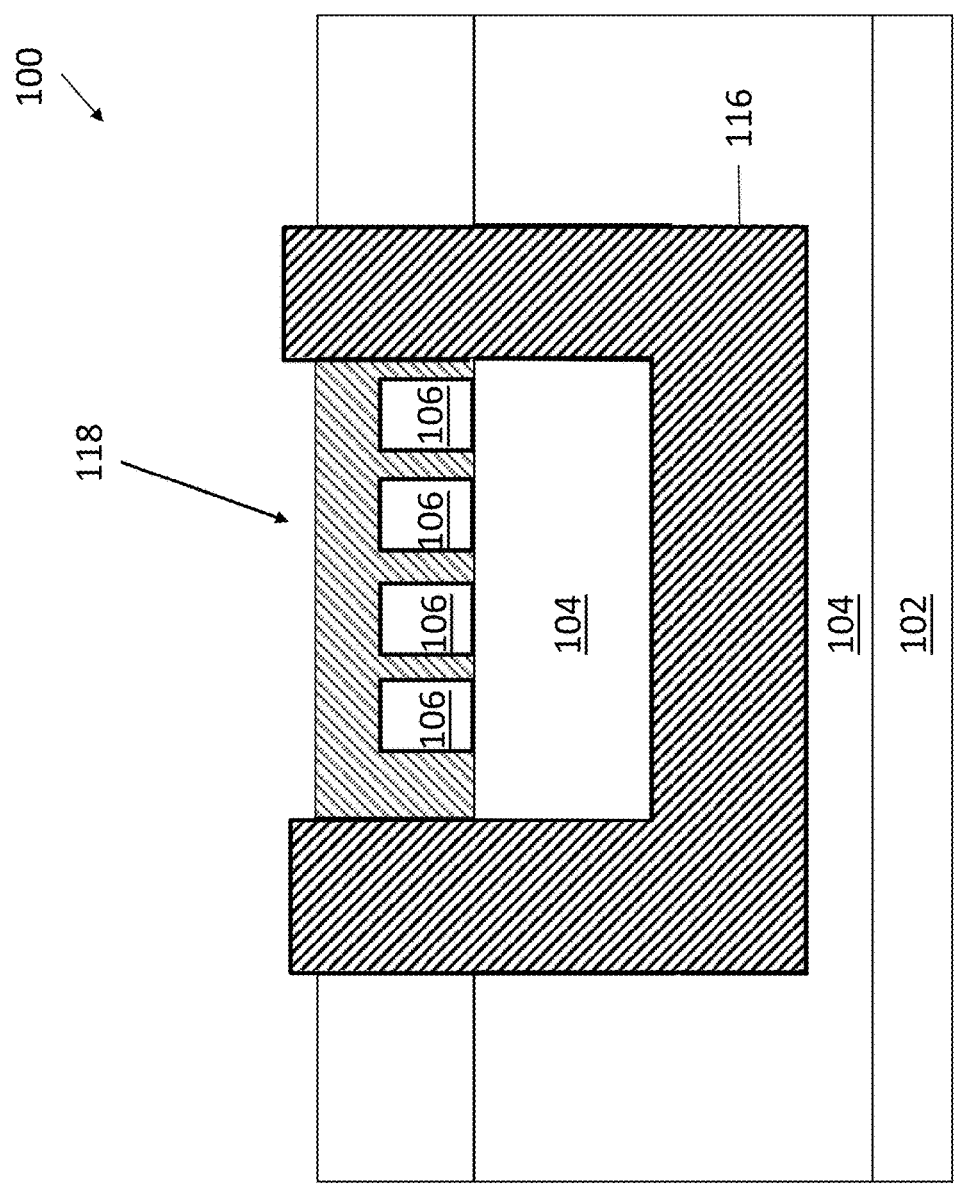
FIG. 11 shows a schematic cross-sectional depiction of a structure undergoing a process according to various additional embodiments.
Figure 12:
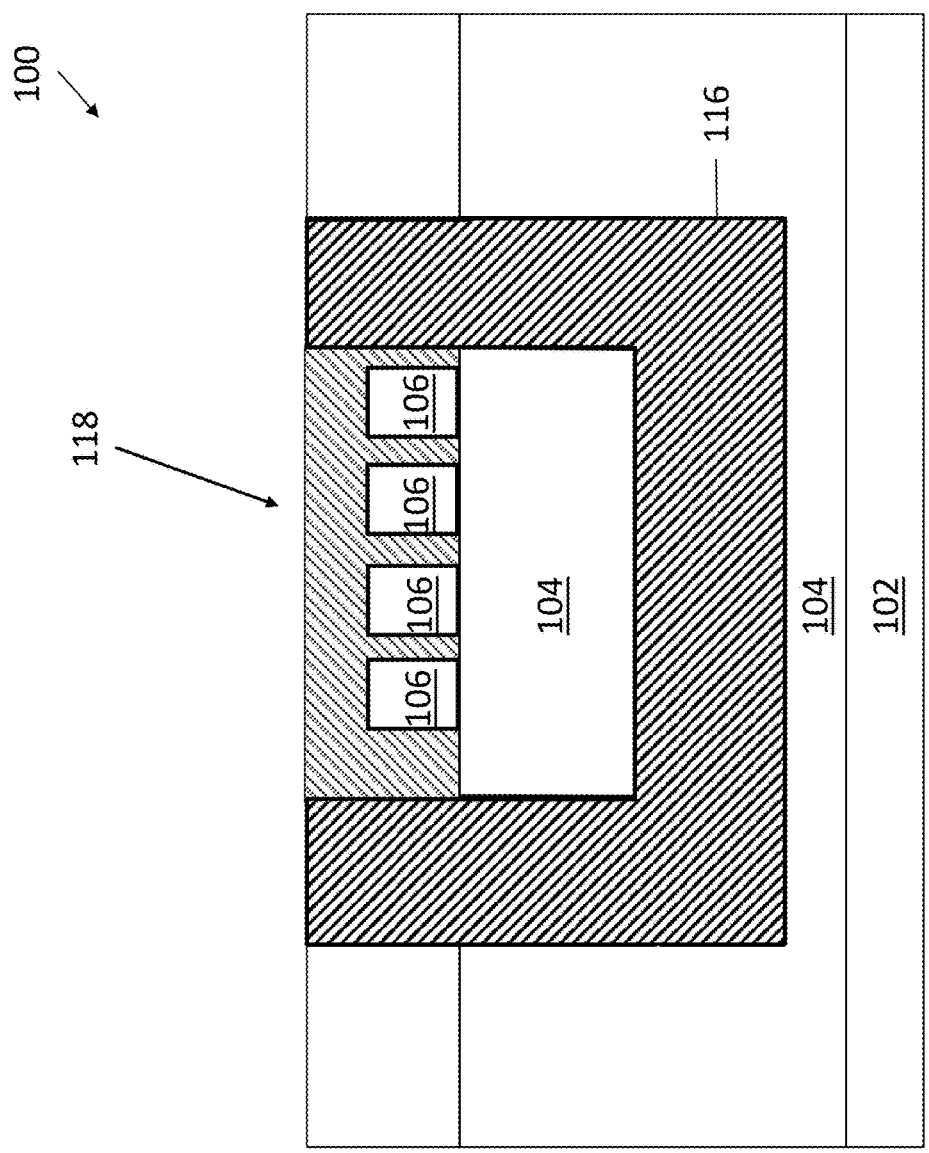
FIG. 12 shows a schematic cross-sectional depiction of a structure undergoing a process according to various other embodiments.
Figure 13:
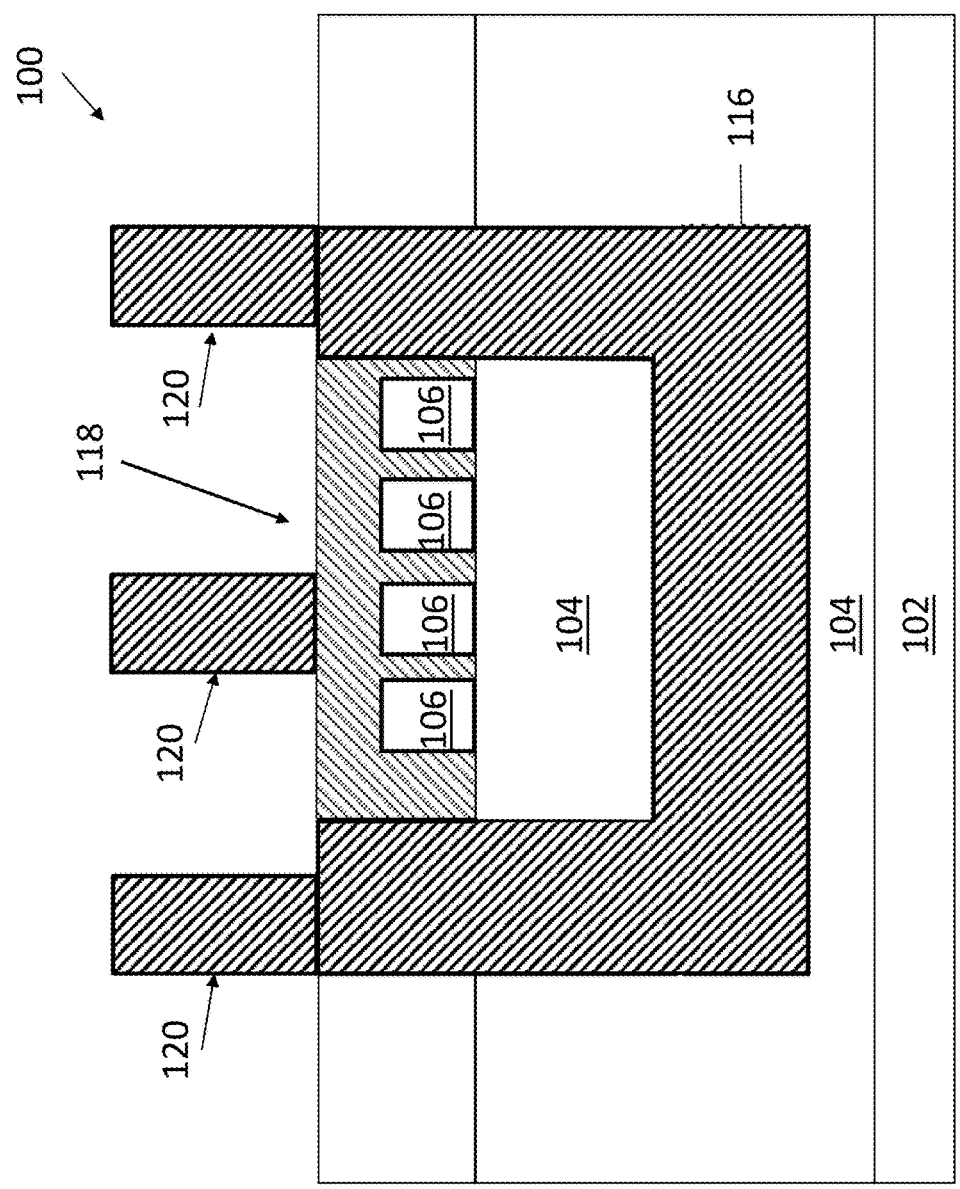
FIG. 13 shows a schematic cross-sectional depiction of an integrated circuit (IC) structure according to various other embodiments.

FIGS. 8-13 illustrate processes in an additional method according to various embodiments. FIG. 8 is a reproduction of FIG. 1, which demonstrates a precursor structure already containing a transistor, such as fins 106, or similar device layer. As in the above embodiments (FIGS. 1-7), masks 108 may be applied prior to implanting the precursor structure with a material, for instance silicon. In FIG. 9, access ports 112 are etched utilizing additional mask 108. In FIG. 10, at least one tunnel 14 is etched using similar methods to those described above in reference to FIG. 3. Masks 108 may be removed at this point. In FIG. 11, as in FIG. 4, a conductor may be deposited into tunnel 14 to form wire 116. In FIG. 12, a top surface may be planarized. In some embodiments, wire 116 may be electrically isolated at this point. In an alternative embodiment, as illustrated in FIG. 13, wire 116 may be electrically contacted to a set of wiring layers 120, which may include or may be connected to a set of contacts disposed above wiring layers 118.

In embodiments as illustrated in FIGS. 1-7, wherein the subsurface tunnel 114 is formed prior to the formation of a transistor, an IC 100 that may not be able to tolerate extra processing, thus demanding low processing temperatures, may benefit from the formation of tunnel 114 and wire 116 before the formation of wiring layers 118. In contrast, embodiments as illustrated in FIGS. 8-13 can be useful where IC 100 has a greater flexibility in tolerating thermal cycles. For instance, referring back to FIG. 10, there may be a need to anneal tunnel 114 to remedy any damage caused by implanting and etching into buried insulator layer 104. Embodiments as illustrated in FIGS. 8-13 require a more robust device that allows for engineering around an existing structure, such as wiring layers 118, as compared to the embodiments illustrated in FIGS. 1-7, which create tunnel 114 prior to full device formation.

Using embodiments of the present invention, IC 100 can be formed. In some embodiments IC structure 100, as illustrated in FIG. 7, may include substrate 102, buried insulator layer 104 over substrate 102. Additionally, IC 100 can include at least one wire 116 within buried insulator layer 104, wherein at least one wire is substantially parallel to and below an upper surface of buried insulator layer 104; wiring layers 118, in a silicon on insulator layer 106, above buried insulator layer 104 and the at least one wire 116. In some embodiments, a set of wires 120 may extend around transistor 106 in silicon on insulator layer 106 and through buried insulator layer 104 to electronically contact the at least one wire 116 within buried insulator layer 104. In embodiments, at least one wire 116 and set of wires 120 may include at least one of a group comprising: doped polysilicon, tungsten, and indium. In some embodiments set of wires 120 are electrically isolated from the transistor. In an alternative embodiment, set of wires 120 and at least one wire 116 are electrically connected to a set of wiring layers electrically connected to a set of contacts disposed above wiring layers 118.

The methods described above can be useful in creating subsurface tunnels 114 and wires 116 for devices requiring subsurface interconnects and local interconnects. For instance, static random access memory (SRAM) devices may benefit from methods disclosed according to some embodiments. In some embodiments, the above methods may be utilized in any analog devices, wherein tunnel 114 allows for creating a tie to a local, clean ground away from the substrate, thus reducing noise created in analog devices according to prior methods. In embodiments wherein wire 116 is isolated, it may be used for a thermal path, especially in analog devices, hot DC devices, DC output drivers, and other devices that can overheat. The use of wire 116 in such embodiments provides a thermal path and reduces heat at the device. In embodiments where wire 116 is connected to other wires or contacts, interference with wiring layers 118 can be reduced by having the wire below the surface.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method comprising:
   masking a structure with a mask to cover at least a portion of the structure under the mask, the structure comprising: a substrate, a buried insulator layer disposed above the substrate, and a semiconductor layer disposed above the buried insulator layer;
   implanting a material through the semiconductor layer and into the buried insulator layer forming an implant region, wherein the implant region is substantially parallel to and below an upper surface of the structure;
   masking an additional portion of the structure with an additional mask to cover an additional portion under the additional mask;
   etching a set of access ports though the semiconductor layer and partially through the insulator layer into the implant region in the buried insulator layer;
   etching at least one tunnel below the upper surface of the structure in the implant region using the set of access ports by removing at least a portion of the implant region; and
   depositing a conductor into the at least one tunnel and the set of access ports.

2. The method of claim 1, wherein the material comprises silicon.

3. The method of claim 1, wherein the conductor includes at least one of a group comprising: doped polysilicon, tungsten, and indium.

4. The method of claim 1, wherein the etching of the set of access points comprises reactive-ion etching (RIE) etching.

5. The method of claim 1, wherein the etching of the at least one tunnel comprises vapor hydrofluoric acid (Vapor HF) etching.

6. The method of claim 1, further comprising:
   planarizing, following the depositing, the upper surface of the structure; and
   forming a transistor on the upper surface of the structure.

7. The method of claim 6, further comprising:
   contacting the conductor to a set of wiring layers electrically connected to a set of contacts disposed above the transistor.

8. The method of claim 1, wherein a center of the at least one tunnel is approximately 50 nanometers (nm) to approximately 150 nm below a bottom surface of the semiconductor layer.

9. The method of claim 8, wherein the at least one tunnel is between approximately 100 nm and approximately 1000 nm long, approximately 50 nm wide, and approximately 50 nm deep.

10. A method comprising:
    masking a structure with a mask to cover at least a portion of the structure under the mask, the structure comprising: a substrate, a buried insulator layer disposed above the substrate, and a semiconductor layer disposed above the buried insulator layer, and a transistor above the semiconductor layer;
    implanting a material through the transistor and semiconductor layer and into the buried insulator layer, forming an implant region, wherein the implant region is substantially parallel to and below an upper surface of the structure;
    masking an additional portion of the structure with an additional mask to cover the transistor;
    etching a set of access ports though the semiconductor layer and partially through the buried insulator layer into the implant region in the buried insulator layer;
    etching at least one tunnel below the upper surface of the structure in the implant region using the set of access ports by removing at least a portion of the implant region; and depositing a conductor into the at least one tunnel and the set of access ports.

11. The method of claim 10, wherein the material comprises silicon.

12. The method of claim 10, wherein the conductor includes at least one of a group comprising: doped polysilicon, tungsten, and indium.

13. The method of claim 10, wherein the etching of the set of access points comprises reactive-ion etching (RIE) etching.

14. The method of claim 10, wherein the etching of the at least one tunnel comprises vapor hydrofluoric acid (Vapor HF) etching.

15. The method of claim 10, further comprising:
planarizing an upper surface of the structure.

16. The method of claim 15, further comprising:
contacting the conductor to a set of wiring layers electrically connected to a set of contacts disposed above the transistor.

17. The method of claim 10, wherein the at least one tunnel is between approximately 50 nanometers (nm) and approximately 150 nm below a bottom surface of the semiconductor layer, and wherein the at least one tunnel is between approximately 100 nm and approximately 1000 nm long, approximately 50 nm wide, and approximately 50 nm deep.

\* \* \* \* \*